United States Patent [19]

Recchia et al.

[11] 3,912,516

[45] Oct. 14, 1975

[54] PHOTOPOLYER COMPOSITION CONTAINING A POLYURETHANE BINDING AGENT

[75] Inventors: Frank P. Recchia, New Haven; Tilak M. Shah, North Haven, both of Conn.

[73] Assignee: The Upjohn Company, Kalamazoo, Mich.

[22] Filed: July 27, 1973

[21] Appl. No.: 383,377

[52] U.S. Cl. .......................... 96/85; 96/33; 96/35.1; 96/36; 96/36.3; 96/86 R; 96/87 R; 96/115 P; 96/115 R; 204/159.15; 204/159.19

[51] Int. Cl.$^2$... G03C 1/68; G03C 5/00; G03F 7/02; G03F 8/00

[58] Field of Search......... 96/35, 87 R, 115 R, 35.1, 96/86 R; 204/159.19, 159.15

[56] References Cited

UNITED STATES PATENTS

| | | | |
|---|---|---|---|
| 2,760,863 | 8/1956 | Plumbed | 96/115 R |
| 2,914,556 | 11/1959 | Hostettler et al. | 260/484 P |
| 2,948,611 | 8/1960 | Barney | 96/35.1 |
| 3,509,102 | 4/1970 | Horn et al. | 260/77.5 AN |
| 3,642,924 | 2/1972 | Morikawa et al. | 252/341 |
| 3,658,531 | 4/1972 | Kurtz | 96/115 R |
| 3,681,291 | 8/1972 | Khan | 260/77.5 AN |
| 3,782,961 | 1/1974 | Takahashi et al. | 96/115 R |

OTHER PUBLICATIONS

Saunder, et al., Polyurethanes, Chemistry Anptechnology, Part I, 1963, pp. 228–232.

*Primary Examiner*—Roland E. Martin, Jr.
*Assistant Examiner*—J. P. Brammer
*Attorney, Agent, or Firm*—Denis A. Firth; John Kekich

[57] ABSTRACT

A photopolymerizable element for the preparation of relief printing plates. The element comprises an addition polymerizable monomer (e.g. trimethylolpropane trimethyacrylate), a free radical initiator for polymerizing the monomer (e.g. benzophenone) and a polyester-based polyurethane binding agent which is the reaction product of 4,4'-methylenebis(phenyl isocyanate), a polycaprolactone diol having a molecular weight in the range of 1,000 to 2,500, and a mixture of at least two aliphatic diol extenders. Optionally the photopolymerizable element is provided with a support layer such as a polyester film or paper.

Processes for the preparation of relief printing plates from said elements are also disclosed.

12 Claims, No Drawings

PHOTOPOLYER COMPOSITION CONTAINING A POLYURETHANE BINDING AGENT

BACKGROUND OF THE INVENTION

1. Field of the Invention

This invention relates to photopolymerizable elements and relief image printing plates derived therefrom and is more particularly concerned with photopolymerizable elements comprising a polymerizable monomer and a polymerization initiator incorporated in a polyurethane binding agent and with relief image printing plates derived therefrom.

2. Description of the Prior Art

It is known to prepare photopolymerizable elements suitable for the preparation of relief image printing plates by casting or molding into a sheet-like form a mixture of (a) an addition of polymerizable monomer having ethylenic unsaturation, (b) a free radical initiator for said monomer which is activatable by light, and (c) a suitable base material which can be one of a wide variety of materials including rubber and synthetic polymers; see Plambeck U.S. Pat. No. 2,760,863. It is also known that polyether-based polyurethanes can be employed as the base material in such compositions; see Barney U.S. Pat. No. 2,948,611. The use has also been reported of polyether-based polyurethanes, which contain ethylenic unsaturation in the chain thereof and which thereby can be used in place of a polymerizable monomer; see Kurtz U.S. Pat. No. 3,658,531.

We have now found that photopolymerizable elements which have improved properties (to be discussed hereafter), and which give rise to relief image printing plates having improved properties, are obtained by employing certain polyester-based polyurethanes as the base material in the above types of compositions.

SUMMARY OF THE INVENTION

This invention comprises:

a photopolymerizable element for use in preparing relief printing plates comprising:

a. an addition polymerizable ethylenically unsaturated compound having a boiling point above 100°C at normal atmospheric pressure;

b. a free radical generating addition polymerization initiator activatable by actinic radiation;

c. a compatible polyurethane binding agent comprising the product of reaction of i. 4,4'-methylenebis(phenyl isocyanate)

ii. a polycaprolactone diol having a molecular weight in the range of about 1,000 to about 2,500; and iii. a mixture of at least two different aliphatic diols of from 2 to 6 carbon atoms, inclusive;

the ratio of equivalents of polycaprolactone diol (ii) to total equivalents of said aliphatic diols (iii) being within the range of 1:1.5 to 1:7, and the ratio of equivalents of isocyanate (i) to total equivalents of polyols (ii) and (iii) being within the range of 0.94:1 to 0.98:1.

The invention also comprises a process for making relief printing plates from the above photopolymerizable elements and the relief printing plates so made.

The photopolymerizable elements of the invention can have varying degrees of hardness from about a Shore A hardness of the order of 50 to a Shore D of the order of 60. The former, softer materials are highly flexible whereas the latter materials are harder and more rigid but still capable of being flexed when fabricated in sheet form.

The photopolymerizable elements of the invention are characterized by (a) their excellent etching properties which permit the production of relief images by medium and high solvent etching pressures with high resolution and without undesirable undercutting of the image, (b) their lack of "built-in memory" in the polymer i.e. the element in sheet form, either before or after curing, can be flexed into a desired configuration (e.g. bent to the curvature of a printing press cylinder) without showing any tendency to curl at the edges or otherwise return to its original configuration, and (c) the excellent printing characteristics and resistance to wear of the relief printing plates prepared from the above elements.

These properties, which will be discussed in more detail hereafter, distinguish the photopolymerizable elements of the invention (and the relief plates produced therefrom) from previously known elements based on the use of other types of polyurethanes as the compatible binding agent.

DETAILED DESCRIPTION OF THE INVENTION

The photopolymerizable elements of the invention are prepared by incorporating the polymerizable monomer and the initiator into the polyurethane-forming reaction mixture and then casting or molding or extruding the resulting polyurethane into whatever shape and form is desired.

The improved properties of the photopolymerizable elements of the invention are, in large measure, attributable to the use of the particular polyester-based polyurethanes which are employed as the compatible binding agent. The polyurethanes in question are those derived by reaction of 4,4'-methylenebis(phenyl isocyanate), a polycaprolactone diol of a molecular weight in the specified range, and a mixture of at least two different aliphatic diols.

The polycaprolactone diols in question are prepared by polymerizing ε-caprolactone with a difunctional initiator such as an aliphatic glycol (or an amino alcohol such as ethanolamine, propanolamine, butanolamine and the like) using procedures known in the art; see, for example, U.S. Pat. No. 2,914,556. A particularly preferred polyester diol is that obtained by polymerizing ε-caprolactone using ethylene glycol as initiator. The polycaprolactone diols used to prepare the compatible binding agents of the present invention have molecular weights within the range of 1,000 to about 2,500 and preferably within the range of 1,900 to about 2,100.

The mixture of aliphatic diols employed in making the polyurethane binding agents are mixtures of at least two aliphatic diols having from 2 to 6 carbon atoms such as ethylene glycol, 1,3-propanediol, 1,4-butanediol, 1,5-pentanediol, 1,6-hexanediol, 1,3-butanediol, 2,2-dimethyl-1,3-propanediol, diethylene glycol, dipropylene glycol, dibutylene glycol, and the like. A preferred combination of diols is a mixture of dipropylene glycol with 1,4-butanediol, 1,6-hexanediol, diethylene glycol or mixtures of two or all three of the latter compounds.

The aliphatic glycols are employed advantageously in such proportions that there is never less than 5 parts by weight of any one glycol per 100 parts per weight of mixture where the mixture contains two diols. Preferably, where a mixture of two diols is employed the proportion of either one is within the range of 25 to 75 parts by weight per 100 parts of the mixture of the two diols. When a mixture of three or more diols is employed it is preferred that there always be at least 10 percent and not more than 80 percent by weight of any one diol in the mixture.

The reaction between the 4,4'-methylenebis(phenyl isocyanate), polycaprolactone diol and the mixture of aliphatic diols is carried out in accordance with one-shot or prepolymer techniques which are known in the art. The one-shot procedure is preferred. In preparing the polyurethane binding agents by the latter method the reactants, together with the polymerizable monomer and the polymerization initiator which are to be included in the reaction mixture in order to produce the desired photopolymerizable element, can be admixed in any order. Advantageously, all the polyols plus the polymerizable monomer and the polymerization initiator are blended and then admixed with the diisocyanate.

The mixing of the reactants can be accomplished by any of the procedures and apparatus conventional in the art. Preferably the individual reactants are rendered substantially free from the presence of moisture using conventional procedures, for example, by azeotropic distillation using e.g. benzene or toluene as solvent, or by heating under reduced pressure at a temperature above the boiling point of water at the pressure employed. After all the reactants have been brought together the reaction mixture is subjected to degassing, for example by reducing the pressure under which the mixture is maintained, before transferring the reaction mixture to suitable molds or extrusion equipment.

Advantageously, but not essentially, a catalyst is included in the polyurethane forming reaction mixture. Any of the catalysts conventionally employed in the art to catalyze the reaction of an isocyanate with a reactive hydrogen containing compound, can be employed for this purpose; see, for example, Saunders et al. Polyurethanes, Chemistry and Technology, Part I, Interscience, New York, 1963, pages 228–232. Such catalysts include organic and inorganic acid salts of, and organometallic derivatives of, bismuth, lead, tin, iron, antimony, uranium, cadmium, cobalt, thorium, aluminum, mercury, zinc, nickel, cerium, molybdenum, vanadium, copper, manganese and zirconium, as well as phosphonies and tertiary organic amines. Representative organotin catalysts are stannous octoate, stannous oleate, dibutyltin dioctoate, dibutyltin dilaurate and the like. Representative tertiary organic amine catalysts are triethylamine, triethylenediamine, N,N,N',N'-tetramethylethylenediamine, N-methylmorpholine, N-ethylmorpholine, N,N,N',N'-tetramethylguanidine, N,-N,N',N'-tetramethyl-1,3-butanediamine, N,N-dimethylethanolamine and N,N-diethylethanolamine. The amount of catalyst employed is generally within the range of about 0.01 to about 2.0% by weight based on the total weight of reactants. Preferably the amount of catalyst is within the range of about 0.025 to about 0.05% by weight based on total reactants.

Both the one-shot and the prepolymer methods of preparing the polyurethane compositions of the invention can be carried out on a continuous basis as set forth, for example, in U.S. Pat. No. 3,642,964.

When the polyurethane compositions of the invention are prepared by the less preferred prepolymer route, the diisocyanate is first reacted with the polycaprolactone diol and the isocyanate-terminated prepolymer so obtained is then reacted with the mixture of aliphatic diols. The polymerizable monomer and the polymerization initiator are conveniently included in the latter mixture. The steps of dehydration of reaction components and the degassing of the final reaction mixture are applied also in the prepolymer method as in the one-shot method.

The relative proportions in which the various reactants are employed are important. The proportion of polycaprolactone diol to mixed aliphatic diol is advantageously such that there are from about 1.5 to about 7 equivalents of said mixture of diols per equivalent of polycaprolactone diol. When the proportion of mixtures of aliphatic diols to polycaprolactone diol is in the lower end of the range set forth above i.e. from about 1.5:1 to about 2.5:1 the resulting polyurethane will have a hardness in the range of about Shore A 50 to 60 and the photopolymerizable element produced therefrom will be highly flexible. A particularly preferred proportion of aliphatic diol to polycaprolactone diol for the preparation of a highly flexible element is one within the range of 1.8:1 to about 2.1:1. As the proportion of aliphatic diols to polycaprolactone diol increases above about 2.5:1 the resulting polyurethane increases in hardness until it reaches a Shore D hardness of about 60 at a ratio of 7:1. The preferred materials of greater hardness are those having a Shore D hardness in the range of 45 to 60, which materials are obtained by employing a proportion of mixture of aliphatic diols to polycaprolactone diol in the range of about 4:1 to about 7:1.

The proportion of diisocyanate to polyol is such that there are from about 0.94 to 0.98 equivalents of diisocyanate for each 1.0 equivalents of total active hydrogen containing material (i.e. polycaprolactone diol plus mixture of aliphatic diols). Preferably there are 0.96 equivalents of diisocyanate per 1.0 equivalent of total active hydrogen containing material.

The addition polymerizable ethylenically unsaturated compounds employed in preparing the photopolymerizable elements of the invention can be any of those previously employed in this art for the same purpose; see, for example, U.S. Pat. Nos. 2,760,863 and 2,948,611. The compounds all have a boiling point which is greater than about 100°C at normal pressure in order that there shall be no significant loss of said compounds during the exothermic polyurethane-forming reaction involved in the preparation of the photopolymerizable elements. Illustrative of such compounds are the acrylic and methacrylic acid esters of ethylene glycol, diethylene glycol, dipropylene glycol, triethylene glycol, tetraethylene glycol, trimethylene glycol, hexamethylene glycol, trimethylolpropane, pentaerythritol, glycerol, dimethyl maleate, dimethyl fumarate and like dialkyl maleates and fumarates. A preferred polymerizable compound is trimethylolpropane trimethacrylate.

Most commercially available polymerizable monomers, such as those set forth above, contain minor amounts, generally less than 500 parts per million of a polymerization inhibitor such as hydroquinone which serves to prevent gradual polymerization of the monomer on storage. The presence of these inhibitors also serves to prevent polymerization during the formation of the polyurethane in the preparation of the compositions of the invention and has no apparent effect on the ultimate efficiency of polymerization of the monomer on exposure of the photopolymerizable element to activating radiation.

The amount of said addition polymerizable compounds incorporated in the photopolymerizable elements of the invention is advantageously within the range of about 5 to about 20 percent by weight based on total weight of the composition. Preferably the amount of said addition polymerizable compound is within the range of 8 to 12 percent by weight based on total weight of the composition.

Similarly any of the free radical generating addition polymerization initiators previously employed in the art (see supra) for the same purpose can be used in the preparation of the photopolymerizable elements of the invention. It is necessary to employ initiators which are not thermally activatable at the temperatures generated in the exothermic reaction involved in the formation of the polyurethane binder i.e. the initiator should not be activatable at temperatures of less than about 100°C. Illustrative of such initiators are benzoin, diacetyl, benzil, benzoin methyl ether, benzoin ethyl ether, $\alpha$-methyl benzoin, $\alpha$-phenylbenzoin, benzophenone, Michler's ketone, and the like.

The amount of the polymerization initiator incorporated in the photopolymerizable elements of the invention is advantageously within the range of about 2 to about 10 percent by weight based on total weight of the composition. Preferably the amount of said polymerization initiator is within the range of 3 to 6 percent by weight based on total weight of the composition.

In preparing printing plates from the photopolymerizable elements of the invention it is appropriate to use procedures described in the art. Thus the element is prepared in suitable form, generally as a thin sheet of thickness of the order of 0.5 inches or less, by molding, extrusion, or by casting from solution in organic solvents such as acetone, methyl ethyl ketone, tetrahydrofuran, dimethyl formamide, acetonitrile and like and mixtures of any of said solvents with water and/or alcohols such as methanaol, ethanol, isopropyl alcohol, and the like.

The element in sheet form can be supported on a base or can be unsupported depending upon the particular use for which it is to be employed. In the case of supported sheets the base can be fabricated from any of a wide variety of materials including metals such as copper, aluminum, and the like, paper, particularly open fibered paper, and synthetic polymers, preferably in sheet or film form, such as polyesters, of which polyethylene terephthalate is typical, cellulose esters, polyvinyl chloride, polyvinyl alcohol, polyvinyl acetate, polyamides, polyimides, polyurethanes and the like. In a particularly preferred form the photopolymerizable elements of the invention are provided with a supporting base in the form of a transparent film of a polyester such as polyethylene terephthalate of which the product sold under the trade name Mylar is typical. The photopolymerizable element is preferably bonded to the supporting base. In many instances the element is self-bonding to the support but, if desired or necessary, an appropriate adhesive is employed to effect the bonding.

The process of preparing a finished printing plate from the photopolymerizable element, whether this be supported or unsupported, comprises the following steps. A positive or negative of the image to be reproduced (i.e. a line or half-tone negative or positive) is placed over the surface of the photopolymerizable element. Obviouisly, in the case of supported elements, the negative or positive is placed on that face of the photopolymerizable element which is not bonded to the support. The photopolymerizable element is then exposed, via the positive or negative, to irradiation from an appropriate source of actinic radiation. Such sources include carbon arcs, mercury vapor lamps, fluorescent lamps, argon glow lamps, photographic flood lamps, tungsten lamps, xenon lamps, pulsed xenon lamps and the like. Preferably the source of radiation is one which generates light of wavelength within the range of about 260 nm to about 500 nm.

The time for which the irradiation is permitted to continue depends, in part, on the rate at which polymerization of the polymerizable monomer takes place in a given photopolymerizable element and, in part, on the depth beneath the surface of the element to which it is desired that polymerization should take place. The latter depth will obviously be dependent to some extent on the actual thickness of the element but, in any event, should obviously be greater than the depth to which the plate is to be etched in the subsequent step to produce the relief image. In general, the minimum depth to which polymerization is allowed to take place is of the order of 0.5 mils. The actual depth to which polymerization is allowed to take place will be different for different applications and no specific ranges need be given here. The exposure time necessary to achieve any particular depth of polymerization for a given photopolymerizable element of the invention can be determined readily by a process of trial and error.

After the exposure to radiation has been carried out to achieve the desired depth of polymerization, the image positive or negative is removed and the relief image is developed by solvent etching or other means of removal of the unexposed (i.e. unpolymerized) material remaining on the photopolymerizable element. In the case of those elements which are unsupported it is first desirable to expose the reverse side of the element (i.e. that side which has not been exposed imagewise to radiation) to radiation for a time sufficient to produce a uniform layer of polymerized material on said surface. This procedure avoids subsequent damage or erosion of the underside of the element during the etching step.

The most convenient way in which to develop the relief image on the photopolymerizable element, after the imagewise exposure, is to subject the exposed surface of the element to the action of a solvent which will dissolve out the unpolymerized, unexposed portions of the face of exposed element. The solvent treatment can be carried out by spraying the element with solvent, immersing the element in a bath of solvent or by combinations of both. A preferred technique consists of spraying the face of the element using medium or high pressure jets of solvent in order to complete the operation as quickly as possible. One of the highly useful properties of the photopolymerizable elements of the invention is that unpolymerized material thereof is readily soluble in a wide variety of solvents whereas the polymerized material is substantially insoluble therein. Such solvents include acetone, methyl ethyl ketone, tetrahydrofuran, dimethyl-formamide, acetonitrile and mixtures thereof with water and/or alcohols such as methanol, ethanol, isopropyl alcohol and the like.

A further advantage of the photopolymerizable elements of the present invention, and a further distinction over elements heretofore known, is that the particular polyurethane binder employed therein is not only transparent but freely transmits the radiation employed to activate the polymerizable monomer without causing any significant sideways refraction or dispersion of the radiation. This not only produces a very sharp image but it ensures that the angle of the sidewalls of the image make with the horizontal base of the plate is approximately in the range of 60° to 90°.

An alternative mode of development of the image on the exposed photopolymerizable element involves mechanical brushing of the exposed surface with solvent thereby effecting removal of unpolymerized material by a combination of the mechanical abrasion and solvent etching. This technique is, however, less readily adaptable to large scale processing operations.

A particularly useful etching technique, especially in the case of relatively thin elements, comprises immersing the element in the etching solvent and applying ultrasonic energy thereto.

The depth to which the etching or development of the image is permitted to proceed can be varied as desired, depending upon the end use for which the plate is to be employed. The minimum depth of etching is generally of the order of about 0.5 mils. In the case of unsupported elements it is generally undesirable to etch through the total depth of the element in order to avoid production of holes in the plate. In the case of such plates the maximum depth of etching is generally of the order of about 25 mils. However, in the case of supported elements in which the photopolymerizable layer has been bonded to a support base it is possible to etch completely through the exposed photopolymerizable layer and expose portions of the base without any deleterious effect on the useful properties of the relief image so produced.

The excellent behavior of the photopolymerizable elements of the invention upon exposure to radiation and to subsequent solvent etching is in marked contrast to that of photopolymerizable elements prepared using other polyurethane binding agents. For example, those prepared from the same polycaprolactone diols as called for by the present disclosure but employing only a single aliphatic diol extender show severe curling and deformation of the relief image particularly during the solvent etching cycle. Similar behavior is exhibited by photopolymerizable elements produced using polyurethane binding agents in which polyester polyols other than those based on polycaprolactone are employed.

The photopolymerizable elements of the invention and the relief image plates produced therefrom are also characterized by good physical strength properties, resistance to abrasion and to acids, by their ready acceptance of both oil-based and water based inks and by their improved ink transfer capability as compared with related elements hitherto known. In yet a further advantageous characteristic, the plates are capable of being recycled (by methods commonly employed in the molding art) when either in unsupported or supported form.

As discussed above one of the methods of preparing a photopolymerizable element in sheet form in accordance with the invention is to dissolve the mixture of photopolymerizable monomer, initiator and polyurethane binder (either as the separate elements or after previous compounding as described above) in a solvent, such as those set forth in exemplary of etching solvents, and to cast a film using said solution. Such solutions, in addition to being useful for the casting of photopolymerizable elements in sheet form, are also useful for the application of protective coatings to a wide variety of substrates. For example, said solutions can be used to apply protective coatings to walls, floors, furniture, upholstery, wooden structures or the like. After application of the coating in any conventional manner such as by brushing, spraying and the like, the coating is exposed to radiation as described above to effect crosslinking and thereby generate a coating having high physical strength and resistance to abrasion. In a particular application of the solutions of the photopolymerizable compositions of the invention, there can be produced poromeric compositions. For example, by casting a thin sheet of said composition in the manner described above, exposing the sheet to radiation via a negative composed of a multiplicity of fine dots and then etching the exposed material there is obtained a sheet having a multiplicity of fine pores, which sheet is useful as a substitute for leather.

The following examples describe the manner and proces of making and using the invention and set forth the best mode contemplated by the inventors of carrying out the invention but are not to be construed as limiting.

EXAMPLE 1 a. Preparation of photosensitive polyurethane.

A blend was prepared of 25 g. of benzophenone, 50 g. of trimethylolpropane trimethacrylate, 347 g. (0.35 equivalents) of a polycaprolactonediol (equivalent weight = 989; prepared from ε-caprolactone and 1,4-butanediol using the procedure described in U.S. Pat. No. 2,933,478), 15.79 g. (0.35 equivalents) of 1,4-butanediol and 18.8 g. (0.28 equivalents) of dipropylene glycol. The polycaprolactonediol had been dried and degassed previously by heating at 100°C in vacuo for 2 hours. The 1,4-butanediol and dipropylene glycol had previously been dried over molecular sieves. The resulting blend of components was stirred vigorously while 6 drops (0.125 g.) of a 50% w/w solution of stannous octoate in diethyl phthalate was added using a pipette. The mixture so obtained was stirred vigorously for approximately 30 seconds before adding, in one batch, 118.37 g. (0.94 equivalents) of 4,4'-methylenebis(phenyl isocyanate) in the form of a liquid at 45°C. The vigorous stirring was continued for a further 10 seconds and the reaction mixture was then poured on to a Teflon-lined shallow aluminum pan. The cast elastomer (NCO/OH index = 0.96) gelled in about 30 seconds after pour and was tack free in about 15 minutes.

b. Molding of photosensitive element.

A sheet having dimensions 4.75 × 4.75 × 0.062 inch was prepared by compression molding a portion of the photosensitive polyurethane prepared as described above. A 50 g. charge of the material was placed in an appropriately configured two-piece aluminum mold having Teflon-coated inner surfaces. The mold was housed in a bench type hydraulic press capable of exerting a maximum 50,000 pounds force on a 3⅝ inch ram. The mold was heated to 230°F and the polymer was held under moderate pressure until flow began. The pressure on the mold was then increased to 10,000 lbs. and held thereat for 2 minutes before increasing the pressure to 40,000 lbs. After the polymer had been exposed to the latter pressure for 30 seconds the mold was cooled to room temperature using cold water while the pressure was maintained at the same level. Cooling time was about 16 minutes. The finished plate was demolded and found to be freely flexible and free from bubbles or other flaws. The plate had a Shore A hardness of 48.

c. Preparation of flexographic printing plate.

The above plate was covered with a photographic negative showing a weather map and a vacuum frame enclosed in a Mylar sheet was placed over the negative and plate. A vacuum (25 torr) was applied to the set up to ensure intimate contact between the negative and plate. The plate was then exposed, via the negative, to radiation from a scanning medium pressure tubular mercury vapor lamp (range 260–420 nm with a peak at 365 nm). The exposure time was 90 seconds. The negative was removed and the opposite side of the plate, i.e. the side which had not been exposed imagewise, was exposed totally to to the same source of radiation for a period of 25 seconds. The resulting plate was then subjected to solvent etching by clamping the plate, with the imaged side exposed, to a rotating drum in an etching unit equipped with four solvent spray nozzles and a recirculating solvent system. The plate was exposed to spray by methyl ethyl ketone at a pressure of 9 psi for 180 seconds. At the end of this time the plate was dried in a forced air oven at 70°C for 5 minutes, and found to have a depth of etch of 13 mils. The plate showed no tendency to curl or distort and the top surfaces of the etched image were planar and showed no evidence of "cupping".

In marked contrast to the above, a second plate was prepared using the above identified procedure but omitting the dipropylene glycol employed in part (a) and using 1,4-butanediol as the sole extender. The procedure for the preparation of the photosensitive polyurethane was as follows:

A blend was prepared of 25 g. of benzophenone, 50 g. of trimethylolpropane trimethacrylate, 342.12 g. (0.34 equivalents) of a polycaprolactonediol [equivalent weight = 1,006; prepared as described in Example 1(a)] and 30.61 g. (0.68 equivalents) of 1,4-butanediol.

The polycaprolactonediol had been dried and degassed previously by heating at 100°C in vacuo for 2 hours. The 1,4-butanediol had previously been dried over molecular sieves. The resulting blend of components was stirred vigorously while 0.25 g. of a 50% w/w solution of stannous octoate in diethyl phthalate was added. The mixture so obtained was stirred vigorously for approximately 30 seconds before adding, in one batch, 127.26 g. (1.01 equivalents) of 4,4'-methylenebis(phenyl isocyanate) in the form of a liquid at 45°C. The vigorous stirring was continued for a further 10 seconds and the reaction mixture was then poured on to a Teflon-lined shallow aluminum pan. The cast elastomer (NCO/OH index = 0.99) gelled rapidly.

The photosensitive polyurethane so obtained was then molded to form a plate (Shore A hardness 71–2) using the procedure described in Example 1(*b*) and then exposed imagewise and developed as described in Example 1(*c*) above. It was found that very poor etching occurred due to lack of solubility of the unexposed urethane in methyl ethyl ketone and that even prolonged exposure to high pressure solvent gave a very poorly developed image. Further the edges of the plate curled markedly after exposure to solvent and great difficulty was encountered in maintaining the exposed plate in a planar configuration.

EXAMPLE 2

A photosensitive polyurethane was prepared exactly as described in Example 1(*a*) save that the amount of stannous octoate catalyst was doubled (0.25 g.).

A portion of this polymer was compression molded into a plate (4.75 × 4.75 × 0.062 inch) having a Shore A hardness of 50 as described in Example 1(*b*) and the plate was exposed imagewise and then etched with methyl ethyl ketone as described in Example 1(*c*). The etching was carried out for 180 seconds using a solvent pressure of 10 psi and the dried plate was found to have been etched to a depth (average) of 11 mils. The finished plate showed no sign of curling at the edges, the top surface of the image was entirely planar and the inking and printing characteristics were excellent.

A second portion of the photosensitive polyurethane prepared as described above was dissolved in methyl ethyl ketone (25% w/v solution) and cast as a film of average thickness 9 mils using a vacuum plate. The cast film was allowed to dry in air for approximately 48 hours, cured at 190°F for 45 minutes, and then was cut into two pieces. One piece (control) was submitted for determination of physical properties without further treatment. The second piece was exposed to radiation from a scanning medium pressure tubular mercury vapor lamp for 2 minutes before being submitted to physical testing for comparison with the control.

The physical properties of the two samples are shown in Table I. It will be seen that exposure to ultraviolet light has increased significantly the modulus, tensile strength, and tear strength of the sample.

TABLE I

| | | Control sample | Exposed sample |
|---|---|---|---|
| Density g/cc. | | 1.16 | 1.13 |
| Modulus, psi | 50% | 70 | 300 |
| | 100% | 120 | 520 |
| | 200% | 170 | 830 |
| | 300% | 230 | 1220 |
| Tensile psi | | 750 | 2600 |
| Elongation % at break | | 780 | 540 |
| Tensile set % at break | | 200 | 65 |
| Tear Die C, pli | | 120 | 280 |

The above physical properties of the exposed sample are typical of the physical properties of printing plates of the invention having a Shore A hardness of approximately 50.

EXAMPLE 3

Using the procedure described in Example 1(*a*), a photosensitive polyurethane was prepared from the following amounts and proportions of ingredients:

| | | |
|---|---|---|
| Polycaprolactonediol (eq. wt. = 989): | 340.9 g. | (0.345 equiv.) |
| 1,4-butanediol: | 18.6 g. | (0.414 equiv.) |
| Dipropylene glycol: | 18.48 g. | (0.2760 equiv.) |
| 4,4'-methylenebis (phenyl | | |

-Continued

| | | |
|---|---|---|
| isocyanate): | 122 g. | (0.97 equiv.) |
| BENZOPHENONE: | 25 g. | |
| trimethylolpropane trimethacrylate: | 50 g. | |
| Stannous octoate(50% w/w) in diethylphthalate: | 0.125 g. | |
| NCO/OH index: | 0.94 | |

A portion (50 g.) of the polyurethane so obtained was compression molded using the procedure described in Example 1(*b*) with a mold temperature of 230°F to give a plate of Shore A hardness 51.

The plate so obtained was then exposed via a negative using the procedure described in Example 1(*c*) and the exposed plate was etched using methyl ethyl ketone at a pressure of 20 psi for 180 seconds using the procedure described in Example 1(*c*). After drying the etched plate in air for 5 minutes at 70°C the average depth of etching was 16 mils. The resolution of the image was excellent. The plate showed no tendency to curl at the edges and the top surface of the relief image was planar. The inking characteristics and the printing qualities of the plate were excellent.

EXAMPLE 4

Using the procedure described in Example 1(*a*), a photosensitive polyurethane was prepared from the following amounts and proportions of ingredients:

| | | |
|---|---|---|
| Polycaprolactonediol (eq. wt. = 989): | 337.4 g. | (0.341 equiv.) |
| 1,4-butanediol: | 18.42 g. | (0.409 equiv.) |
| Dipropylene glycol: | 18.28 g. | (0.273 equiv.) |
| 4,4'-methylenebis (phenyl isocyanate): | 125.88 g. | (1.00 equiv.) |
| benzophenone: | 25 g. | |
| trimethylolpropane trimethacrylate: | 50 g. | |
| stannous octoate(50% w/w) in diethylphthalate: | 0.125 g. | |
| NCO/OH index: | 0.98 | |

A portion (50 g.) of the polyurethane so obtained was compression molded using the procedure described in Example 1(*b*) with a mold temperature of 260°F to give a plate of Shore A hardness 59–60.

The plate so obtained was then exposed via a negative using the procedure described in Example 1(*c*) and the exposed plate was etched using methyl ethyl ketone at a pressure of 45 psi for 340 seconds using the procedure described in Example 1(*c*). After drying the etched flexographic plate in air for 5 minutes at 70°C the average depth of etching was found to be 5 mils. The resolution of the image was excellent. The plate showed no tendency to curl at the edges even upon standing for several weeks. The top surface of the relief image was planar and the inking and printing characterisitcs of the plate were excellent.

EXAMPLE 5

Using the procedure described in Example 1(*a*), a photosensitive polyurethane was prepared from the following amounts and proportions of ingredients:

| | | |
|---|---|---|
| Polycaprolactone diol (eq. wt. = 989): | 343.9 g. | (0.348 equiv.) |
| 1,4-butanediol: | 17.21 g. | (0.383 equiv.) |
| dipropylene glycol: | 18.64 g. | (0.278 equiv.) |
| 4,4'-methylenebis(phenyl isocyanate): | 120.23 g. | (0.96 equiv.) |
| benzophenone: | 25 g. | |

-Continued

| | |
|---|---|
| trimethylolpropane trimethacrylate: | 50 g. |
| stannous octoate(50% w/w) in diethylphthalate: | 0.125 g. |
| NCO/OH index: | 0.95 |

A portion (50 g.) of the polyurethane so obtained was compression molded using the procedure described in Example 1(*b*) with a mold temperature of 230°F to give a plate of Shore A hardness 52.

The plate so obtained was then exposed via a negative using the procedure described in Example 1(*c*) and the exposed plate was etched using methyl ethyl ketone at a pressure of 20 psi for 180 seconds using the procedure described in Example 1(*c*). After drying the etched flexographic plate in air for five minutes at 70°C the average depth of etching was found to be 13 mils. The resolution of the image was excellent. The plate showed no tendency to curl at the edges even upon standing for several weeks. The top surface of the relief image was planar and the inking and printing characteristics of the plate were excellent.

EXAMPLE 6

This example illustrates the preparation of a flexographic printing plate in accordance with the invention using a photosensitive polyurethane obtained by making the polyurethane without the polymerizable monomer and initiator and introducing the latter into the polyurethane at a later stage.

Using the procedure described in Example 1(*a*) a polyurethane was prepared from the following amounts and proportions of ingredients:

| | | |
|---|---|---|
| Polycaprolactonediol (eq. wt. = 1016): | 349.87 g. | (0.344 equiv.) |
| 1,4-butanediol: | 15.5 g. | (0.344 equiv.) |
| dipropylene glycol: | 18.46 g. | (0.275 equiv.) |
| 4,4'-methylenebis(phenyl isocyanate): | 116.16 g. | (0.93 equiv.) |
| NCO/OH index: | 0.96 | |

A 30 g. aliquot of the polyurethane so prepared was dissolved in 120 ml. of methyl ethyl ketone and 3 g. of trimethylolpropane trimethacrylate and 1.5 g. of benzophenone were added with stirring. A clear solution of photosensitive polyurethane was thereby obtained. A film (approximate thickness 10–13 mil) was cast from a portion of solution using a vacuum plate. The film was dried in air at circa 20°C for 24 hours and then heated for 3 hours at 190°F. A portion of the film was submitted without further treatment to physical testing and a second portion was exposed to radiation from a scanning medium pressure tubular mercury vapor lamp for 90 seconds before being submitted to physical testing.

The physical properties of the two samples were found to be as follows:

TABLE II

| | | Control Sample | Exposed Sample |
|---|---|---|---|
| Density g/cc | | 1.14 | 1.15 |
| Modulus psi | 50% | 100 | 240 |
| | 100% | 150 | 360 |
| | 200% | 190 | 550 |
| | 300% | 270 | 810 |
| Tensile psi | | 1430 | 2720 |
| Elongation % at break | | 860 | 650 |
| Tensile set % at break | | 190 | 105 |
| Tear Die C, pli | | 180 | 280 |

The solution of photosensitive polyurethane in methyl ethyl ketone prepared as described above and used to cast a film suitable as a flexographic plate, can also be used to coat surfaces, e.g. walls, floors and the like to form a coating which can be cured by exposure to ultraviolet or other suitable radiation thereby forming a tough, abrasion-resistant coating on said surface.

EXAMPLE 7

Using the procedure described in Example 1(*a*) but replacing the 1,4-butanediol there used by an equivalent amount of diethylene glycol or 1,6-hexanediol, there was obtained a photosensitive polyurethane of the invention. This photosensitive polyurethane was compression molded into a photosensitive element using the procedure described in Example 1(*b*) and then coverted to a flexographic printing plate using the procedure described in Example 1(*c*).

Similarly, using the procedure described in Example 1(*a*) but replacing the mixture of dipropylene glycol and 1,4-butanediol by an equivalent amount (i.e. total equivalents of diol = 0.63) of a mixture of 1,3-propanediol and diethylene glycol, a mixture of 1,3-propanediol, 1,4-butanediol and 2,2-dimethyl-1,3-propanediol, a mixture of 1,3-butanediol and 1,4-butanediol, a mixture of 2,2-dimethyl-1,3-propanediol and dipropyleneglycol, or a mixture of 1,4-butanediol and diethylene glycol, there were obtained photosensitive polyurethanes of the invention which were converted to photosensitive elements using the procedure of Example 1(*b*) and thence to flexographic printing plates using the procedure described in Example 1(*c*).

EXAMPLE 8

A supported flexographic plate of the invention was prepared as follows:

A portion (50 g.) of the photosensitive polyurethane prepared as described in Example 1(*a*) was compression molded exactly as described in Example 1(*b*) but with a sheet (4.75 × 4.75 inches) of open pore paper (S. P. Warren Trans-Kote Release Paper No. 12,494) placed in the mold with the uncoated side uppermost prior to charging the polyurethane.

The photosensitive element with paper-backing so produced was then covered, on the face opposite to the backing sheet, with a negative and exposed to radiation for a period of 90 seconds using the procedure described in Example 1(*c*). The exposed sheet was developed using methyl ethyl ketone at 15 psi for 180 seconds. After drying the plate at 80°C for 3 minutes in a forced air oven it was found that the plate, in the unexposed regions of the image, had been etched down to the paper backing. The relief portions of the image were found to be firmly attached to the backing sheet and showed no tendency to move or peel from the backing on application of manual pressure.

Similarly backed plates were obtained using aluminum foil, mylar sheet, and copper sheet in place of paper as the backing material. The procedure employed in all cases was essentially the same as that described above. The plates so obtained all showed the same satisfactory properties as the paper-backed plate described above.

EXAMPLE 9

A supported flexographic plate of the invention was prepared as follows:

Using the solution of photosensitive polyurethane prepared as described in Example 6, a film of the polyurethane of approximate thickness 20 ml. was cast on a sheet of Mylar. The Mylar-backed photosensitive element thus obtained was converted to a flexographic printing plate using the exposure and etching procedure described in Example 1(*c*).

EXAMPLE 10

This example illustrates the preparation of a lithographic plate in accordance with the invention.

A solution containing 25 g. of the photosensitive polyurethane prepared as described in Example 5 in 100 ml. of methyl ethyl ketone was prepared. A test piece of aluminum lithographic plate was dip coated in the solution until a coating of thickness approximately 2 ml. had been obtained. The coated plate was dried in an oven at 80°C for 10 minutes and then allowed to cool before being exposed imagewise, via the negative of an ITEK resolution target (Catalog No. XTR 702.111: film size 70 mm × 2 inches: high contrast ΔD = 3.0+) for one minute to radiation from a scanning medium pressure mercury vapor lamp. The exposed plate was then etched in a mixture of ethanol (1 part) and methyl ethylketone (3 parts) for several minutes. The resulting image on the lithographic plate was excellent, showing good adhesion and good resolution (7.1 cycles/mm. = 400 lines/in.)

EXAMPLE 11

The following illustrates the preparation of a photosensitive element of the invention having a hardness of the order of 50 Shore D which element is useful, for example, in the preparation of a master mold to replace the conventional zinc master molds employed to make a stereo-type printing plate.

The photosensitive polyurethane was prepared using the procedure of EXample 1(a) but adjusting the amounts of polyol, diols and diisocyanate to the following Polycaprolactonediol = 216.3 g. (0.219 equiv.)
1,4-butanediol = 59.05 g. (1.314 equiv.)
dipropylene glycol = 14.65 g. (0.219 equiv.)
4,4'-MDI = 209.97 g. (1.68 equiv.)
NCO/OH = 0.96

The amounts of benzophenone, trimethylolpropane trimethacrylate and stannous octoate were unchanged.

The polyurethane so obtained was then molded into sheet form using the procedure described in Example 1(*b*) and the sheet was exposed imagewise and etched using the procedure described in Example 1(*c*) except that the etching was accomplished using tetrahydrofuran at a pressure of 30 psi for approximately 5 minutes. The etched plate was dried for 5 minutes at 90°C. The average depth of etching was approximately 15 mils.

In similar manner a photosensitive element of the invention having a hardness of the order of 45 Shore D and useful for the purpose described above, as well as for the preparation of a letter press plate and a plate for flat bed printing, was prepared using exactly the procedure described in Example 1(*a*) but adjusting the amounts of polyol, diols and diisocyanate as follows:

Polycaprolactonediol = 225.54 g. (0.228 equiv.)
1,4-butanediol = 61.57 g. (1.368 equiv.)
dipropylene glycol = 7.64 g. (0.114 equiv.)
4,4'-MDI = 205.24 g. (1.642 equiv.)
NCO/OH = 0.96

The amounts of benzophenone, trimethylolpropane trimethacrylate and stannous octoate were unchanged.

The polyurethane so obtained was then molded into sheet form using the procedure described in Example 1(*b*) and the sheet was exposed imagewise and etched using the procedure described in Example 1(*c*) except that the etching was accomplished using tetrahydrofuran at a pressure of 30 psi for approximately 5 minutes. The etched plate was dried for 5 minutes at 90°C. The average depth of etching was approximately 15 mils.

We claim:

1. A photopolymerizable composition comprising a. an addition polymerizable ethylenically unsaturated compound having a boiling point above 100°C at normal atmospheric pressure;
b. a free radical generating addition polymerization initiator activatable by actinic radiation;
c. a compatible polyurethane binding agent comprising the product of reaction of
   i. 4,4'-methylenebis(phenyl isocyanate);
   ii. a polycaprolactone diol having a molecular weight in the range of about 1,000 to about 2,500; and
   iii. a mixture of at least two different aliphatic diols of from 2 to 6 carbon atoms, inclusive;
   the ratio of equivalents of polycaprolactone diol (ii) to total equivalents of said aliphatic diols (iii) being within the range of 1:1.5 to 1:7, and the ratio of equivalents of isocyanate (i) to total equivalents of polyols (ii) and (iii) being within the range of about 0.94:1 to 0.98:1.

2. A flexible photopolymerizable composition according to claim 1 wherein the addition polymerizable ethylenically unsaturated compound is trimethylolpropane trimethacrylate.

3. A photopolymerizable composition according to claim 1 wherein the free radical generating addition polymerization initiator activatable by actinic radiation is benzophenone.

4. A photopolymerizable composition according to claim 1 wherein the aliphatic diols in the mixture of diols employed in the preparation of the polyurethane binding agent are 1,4-butanediol and dipropylene glycol in the proportion of 75 parts to 25 parts by weight of the former per part by weight of the latter.

5. A photopolymerizable composition according to claim 1 wherein the polycaprolactone diol (ii) employed in the preparation of the polyurethane binding agent has a molecular weight of about 1,900 to about 2,100.

6. A flexible photopolymerizable composition according to claim 1 and having a Shore A hardness within the range of 50 to 60, wherein the ratio of equivalents of polycaprolactone diol to total equivalents of aliphatic diols is within the range of 1:1.5 to 1:2.5.

7. A photopolymerizable composition according to claim 1 and having a Shore D hardness of 45 to 60 wherein the ratio of equivalents of polycaprolactone diol to total equivalents of aliphatic diols is within the range of 1:4 to 1:7.

8. A photopolymerizable composition according to claim 1 in the form of a sheet which also comprises a thin flexible support layer.

9. A flexible photopolymerizable composition having a Shore A hardness within the range of 50 to 60 for use in preparing relief printing plates comprising:

a. trimethylolpropane trimethacrylate,
b. a free radical generating addition polymerization initiator activatable by actinic radiation;
c. a compatible polyurethane binding agent comprising the product of reaction of
   i. 4,4'-methylene bis(phenyl isocyanate),
   ii. a polycaprolactone diol having a molecular weight in the range of 1,900 to 2,100, and
   iii. a mixture of at least two different aliphatic diols selected from the class consisting of dipropylene glycol, diethylene glycol, 1,4-butanediol and 1,6-hexanediol;
   the ratio of equivalents of (ii) to total equivalents of (iii) being within the range of 1:1.8 to 1:2.1; and the ratio of equivalents of isocyanate (i) to total equivalents of (ii) and (iii) being within the range of 0.94:1 to 0.98:1.

10. A flexible photopolymerizable composition according to claim 9 in the form of a sheet which also comprises a thin flexible support layer.

11. A flexible photopolymerizable composition accordingn to claim 10 wherein the thin flexible support layer is a polyester film.

12. A flexible photopolymerizable composition according to claim 10 wherein the thin flexible support layer is paper.

* * * * *